(12) United States Patent
Joshi et al.

(10) Patent No.: US 7,733,720 B2
(45) Date of Patent: Jun. 8, 2010

(54) METHOD AND SYSTEM FOR DETERMINING ELEMENT VOLTAGE SELECTION CONTROL VALUES FOR A STORAGE DEVICE

(75) Inventors: Rajiv V. Joshi, Yorktown Heights, NY (US); Jente B Kuang, Austin, TX (US); Rouwaida N. Kanj, Round Rock, TX (US); Sani R. Nassif, Austin, TX (US); Hung Cai Ngo, Austin, TX (US)

(73) Assignee: International Business Machines Corporation, Armonk, NY (US)

( * ) Notice: Subject to any disclaimer, the term of this patent is extended or adjusted under 35 U.S.C. 154(b) by 377 days.

(21) Appl. No.: 11/941,161

(22) Filed: Nov. 16, 2007

(65) Prior Publication Data

US 2009/0132873 A1    May 21, 2009

(51) Int. Cl.
*G11C 29/00* (2006.01)

(52) U.S. Cl. .................. 365/201; 365/191; 365/226; 365/227

(58) Field of Classification Search .......... 365/201, 365/191, 226, 227
See application file for complete search history.

(56) References Cited

U.S. PATENT DOCUMENTS

| | | | |
|---|---|---|---|
| 5,297,097 A * | 3/1994 | Etoh et al. ............. | 365/226 |
| 5,687,382 A | 11/1997 | Kojima et al. | |
| 6,031,781 A * | 2/2000 | Tsuji et al. ............. | 365/189.08 |
| 7,551,508 B2 * | 6/2009 | Joshi et al. ............ | 365/226 |
| 2007/0141731 A1 | 6/2007 | Hemink et al. | |
| 2007/0200593 A1 | 8/2007 | Agarwal et al. | |

* cited by examiner

*Primary Examiner*—Pho M. Luu
(74) *Attorney, Agent, or Firm*—Mitch Harris, Atty at Law, LLC; Andrew M. Harris; Libby Z. Toub

(57) ABSTRACT

A method and system for determining element voltage selection control values for a storage device provides energy conservation in storage arrays while maintaining a particular performance level. The storage device is partitioned into multiple elements, which may be sub-arrays, rows, columns or individual storage cells. Each element has a corresponding virtual power supply rail that is provided with a selectable power supply voltage. At test time, digital control values are determined for selection circuits for each element that set the virtual power supply rail to the minimum power supply voltage, unless a higher power supply voltage is required for the element to meet performance requirements. The set of digital control values can then be programmed into a fuse or used to adjust a mask at manufacture, or supplied on media along with the storage device and loaded into the device at system initialization.

24 Claims, 7 Drawing Sheets

METHOD AND SYSTEM FOR DETERMINING ELEMENT VOLTAGE SELECTION CONTROL VALUES FOR A STORAGE DEVICE

CROSS-REFERENCE TO RELATED APPLICATION

This application is related to co-pending U.S. patent application Ser. No. 11/941,168, filed concurrently herewith and entitled "ENERGY EFFICIENT STORAGE DEVICE USING PER-ELEMENT SELECTABLE POWER SUPPLY VOLTAGES", by the same inventors and assigned to the same Assignee. The above-referenced U.S. patent application is incorporated herein by reference.

BACKGROUND OF THE INVENTION

1. Technical Field

The present invention relates generally to storage arrays, and more particularly to a method and system for determining control values for a storage device having per-element selectable power supply voltages.

2. Description of the Related Art

Storage array energy usage vs. performance is a critical trade-off in present-day processing systems. System memory, as well as internal and external processor caches and internal registers, consume a large portion of total system power, particularly in network server systems in which processors and memory modules form the majority of components in the typical server rack. In order to maximize performance, or to provide a specified maximum performance level, the frequency at which the storage arrays are operated is typically raised to a level at which energy consumption limits or diminishing returns are encountered, performance limitations of the technology are encountered, and/or power dissipation limits are reached.

In particular, storage arrays such as static random access memories (SRAMs) have a performance profile in which stability/writability and access time all improve with voltage over the power supply voltage region over which the SRAMs are typically operated. However, as the power supply voltage provided to such storage devices is increased, the power consumption increases dramatically, due to the proportionality of logic transition energy to the square of the voltage. Therefore, while it is desirable to operate such devices at the high end of their practical voltage range, it is also necessary to curtail power requirements for a number of reasons, including power usage, heat generation and reliability reduction.

Below the limits of the technology itself, the primary control of the maximum frequency performance of storage arrays is their operating voltage, which is also the primary factor determining energy usage. Therefore, a tradeoff between energy consumption and performance is typically present. However, the operating voltage for a given performance level also sets a production yield criteria on the storage array devices themselves, as each device typically has a minimum operating voltage at which each element in the storage array will perform reliably and therefore across a production run, a particular specified minimum operating voltage dictates a yield of devices that will operate at that voltage across other ranges of environmental parameters such as temperature.

Within a storage device or other device incorporating a storage array, the minimum operating voltage for various individual element partition levels, e.g., sub-array, column, row or individual cell varies due to variations across the die and the particular design architecture which may place higher performance burdens on particular positions of the elements. However, since the supply voltage is typically distributed as evenly as possible across the array, the minimum reliable operating voltage for the worst-case storage cell typically dictates the minimum operating voltage for the entire storage array. Therefore, the minimum operating voltage for a particular storage array design therefore dictates the minimum nominal energy consumption level for a particular frequency of operation/access to the storage subsystems or processing devices incorporating the storage device design.

It is therefore desirable to provide a storage device having a reduced energy consumption while meeting yield and performance requirements at a specified operating frequency and environment.

SUMMARY OF THE INVENTION

The objective of providing a storage device having a reduced energy consumption while meeting yield and performance requirements is met in a method and system for determining control values that select per-element power supply voltage within a storage device. The method is also embodied in a computer program product having program instructions for carrying out the steps of the method and a workstation computer system including the program instructions.

The storage device is a device partitioned into a plurality of storage elements each having a corresponding virtual power supply rail that is provided with multiple selectable power supply voltages. The storage elements may be sub-arrays, rows, columns or other partitions of the array. The power supply voltage applied to each corresponding virtual power supply rail is selected as a lower one of the multiple operational power supply voltages, unless a higher power supply voltage is needed for the corresponding element to meet performance requirements. A method and system according to the present invention detect elements within the array that have at least one failing or marginal cell or other failing circuit at particular power supply voltage level, and generate a digital voltage control value data set that is ultimately used to the control voltage selection circuit within the storage device during operation of the device. The data set causes the power supply voltage applied to the detected failing or marginal elements to be raised above the nominal power supply voltage desired for lower power consumption operation, so that the circuit(s) within the failing or marginal element are no longer failing or marginal during operation of the storage device.

The digital voltage control value data set may be used to program a fuse set or modify a mask during manufacturing, or the data set may be loaded into the storage array device at system initialization from a non-volatile storage device such as a FLASH memory or a data set stored in an operating system file or other location in a disc storage device.

The storage device may incorporate redundant elements or groups of storage cells across the elements and the method may apply repair by using the redundant elements so that a minimum number of elements are selected for operation at the higher power supply voltage level.

The foregoing and other objectives, features, and advantages of the invention will be apparent from the following, more particular, description of the preferred embodiment of the invention, as illustrated in the accompanying drawings.

BRIEF DESCRIPTION OF THE DRAWINGS

The novel features believed characteristic of the invention are set forth in the appended claims. The invention itself, however, as well as a preferred mode of use, further objectives, and advantages thereof, will best be understood by reference to the following detailed description of an illustrative embodiment when read in conjunction with the accompanying drawings, wherein like reference numerals indicate like components, and:

DESCRIPTION OF ILLUSTRATIVE EMBODIMENT

The present invention concerns methods for determining which elements in storage devices such as static random access memories (SRAMs) should be selected for operation at a higher power supply voltage. By providing a selectable power supply voltage for individual elements within the storage device, the yield of a storage device production run can be increased, by increasing the voltage supplied to marginal elements for which full performance is not obtained at the lower power supply voltage. The marginal elements are generally detected during manufacturing test of the storage device. The above-incorporated U.S. patent application "ENERGY EFFICIENT STORAGE DEVICE USING PER-ELEMENT SELECTABLE POWER SUPPLY VOLTAGES" discloses and claims such storage device, and the present invention concerns methods and systems for obtaining initial voltage selection values for selecting per-element power supply voltages within storage devices such as those disclosed therein. The techniques of the present invention may also be used in conjunction with device repair using redundant elements, so that devices that could otherwise not be repaired to be operable at a desired operating voltage can be used with a higher operating voltage applied to elements that would otherwise fail to meet performance margins. Further, the present invention contemplates methods for optimizing the selection of groups of cells across the elements for replacement, such that the number of elements operating at a higher power supply voltage is minimized while maximizing the performance margins of the storage device.

Thus, the present invention provides a mechanism to determine control values for operating marginal devices at a higher operating voltage without requiring the increase in power consumption/dissipation that would otherwise occur if the entire device were operated at the higher operating voltage. The element partition level at which voltage control is provided may be per-row, per-column, or per-subarray. Per storage cell power supply control is possible, but would require a voltage selector for each cell. Other combinations of storage cells are also possible, such as grouping selected storage cells according to their nominal design performance, but in general, the organization of storage devices such as SRAMs into arrays yields an organized structure for the voltage selection circuits included in the storage devices according to the present invention.

Figure 1:
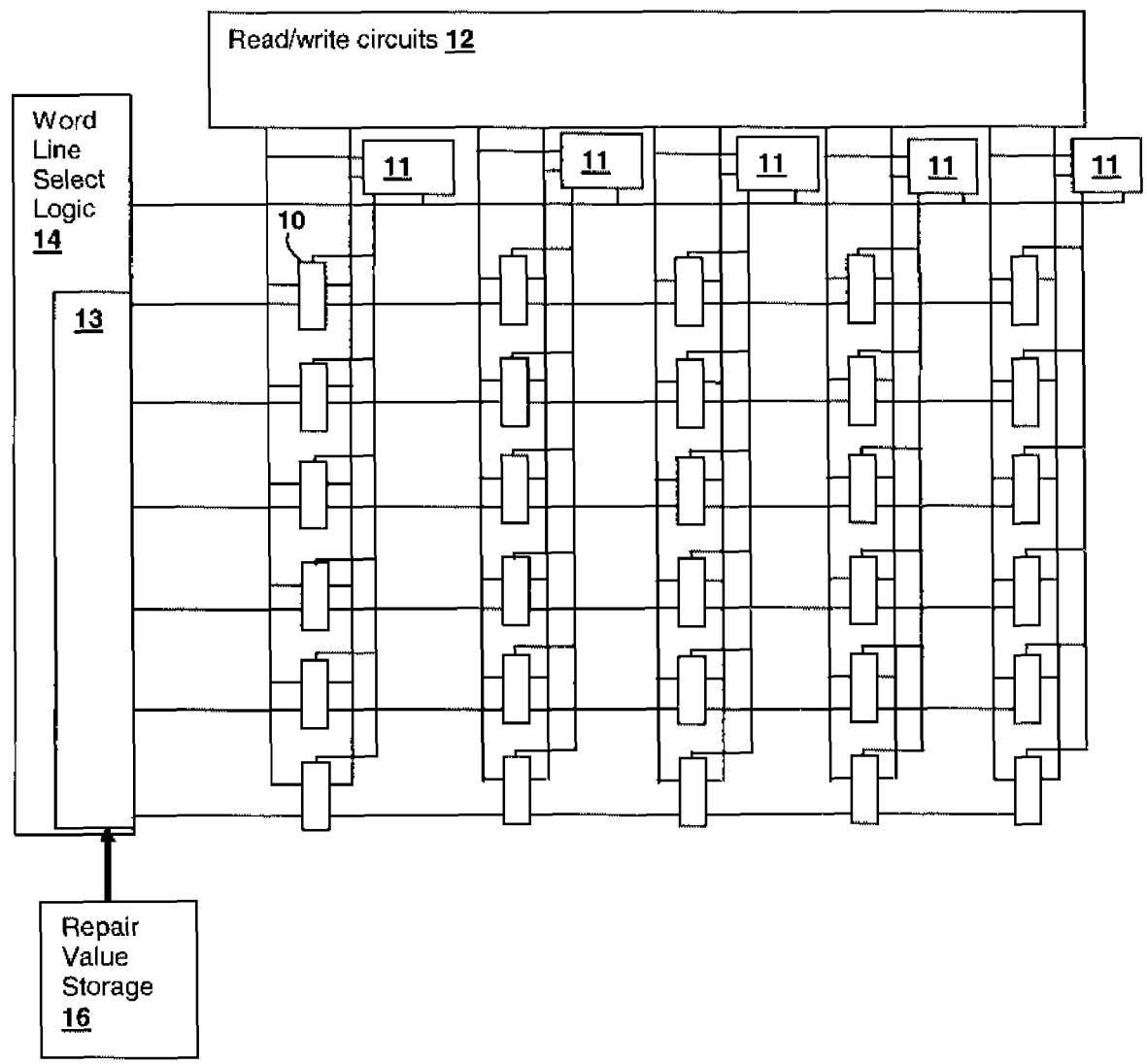
FIG. 1 is a block diagram of a storage array circuit which may be evaluated, repaired and have per-element power supply voltages selected by test methods in accordance with embodiments of the invention.

Referring now to FIG. 1, a storage device in accordance with an embodiment of the present invention is shown in the form of an SRAM storage array circuit. A sub-array of storage cells 10, forming rows and columns are connected to read/write access circuitry. The read/write access circuitry include a word line select logic 14, which activates cells 10 in a row according to word line control signals, and a read/write circuit 12 is connected to the bitlines of the storage array composed of storage cells 10 for performing read/write and for precharging the bitlines connected to storage cells 10 in preparation for a storage cell 10 read access. Read/write circuit also sets the bitline values according to input values provided from write logic during storage cell 10 write accesses and captures the values of the bitlines during storage cell 10 read accesses.

In the depicted array, the power supply voltage for each column of storage cells 10 is selectable by a set of voltage selection circuits 11 that provide power from one of two or more power supply voltage distribution nets, illustrated as voltages $V_{DDHI}$ and $V_{DDLO}$. Voltage selection circuits 11 are coupled to the bitlines of their corresponding column and include functional storage cell capability, so that digital control values that are written to voltage selection circuits 20 control selection of the power supply voltage by writing the digital control values to the additional "row" comprising voltage selection circuits 20. The additional row is connected to an extra wordline control signal provided from wordline select logic 14 so that the digital control values can be written to voltage selection circuits without requiring separate logic.

A redundancy wordline remapping logic 13 is provided in wordline select logic 14, so that additional redundant rows supplied within the storage array may be selected according to a repair value storage 17, which is generally a fuse array, but may also be a non-volatile memory that is programmed at test or a static memory that is programmed at initialization. Also alternatively, the storage for repair selection and voltage selection may be co-located and separate from the array. A repaired array will have at least one of rows de-selected to be replaced by another one of the rows. As mentioned above, the repair and voltage selection can be used in concert to achieve the highest possible yield and lowest power consumption. In general, the repair will be effected so that all of the columns can be operated at power supply voltage $V_{DDLO}$, unless that condition cannot be effected to meet performance margins, in which case the maximum number of columns that can be operated at power supply voltage $V_{DDLO}$ while meeting performance margins will be selected by the digital voltage selection control values.

Different methods according to differing embodiments of the invention are employed depending on the type of redundancy repair available, if any. The following description and the associated FIGS. 2-5 illustrate such methods. In particular, if redundancies are available to effect repairs in the array, then the redundancies may parallel the elements having selectable operating voltage in that the elements are the same (e.g., the array has selectable power supply voltage for the columns and the redundant groups of cells are also columns), or the redundancies may be orthogonal to the elements having selectable power supply voltage (e.g., the array has selectable power supply voltage for the columns and the redundant groups of cells are rows). Alternatively, the selection of power supply for the elements having selectable power supply voltage may be the only repair considered by the method, as in the case in which redundancies are not available for repair at all.

The various exemplary methods will be described in further detail below with reference to the corresponding Figures.

Figure 2:
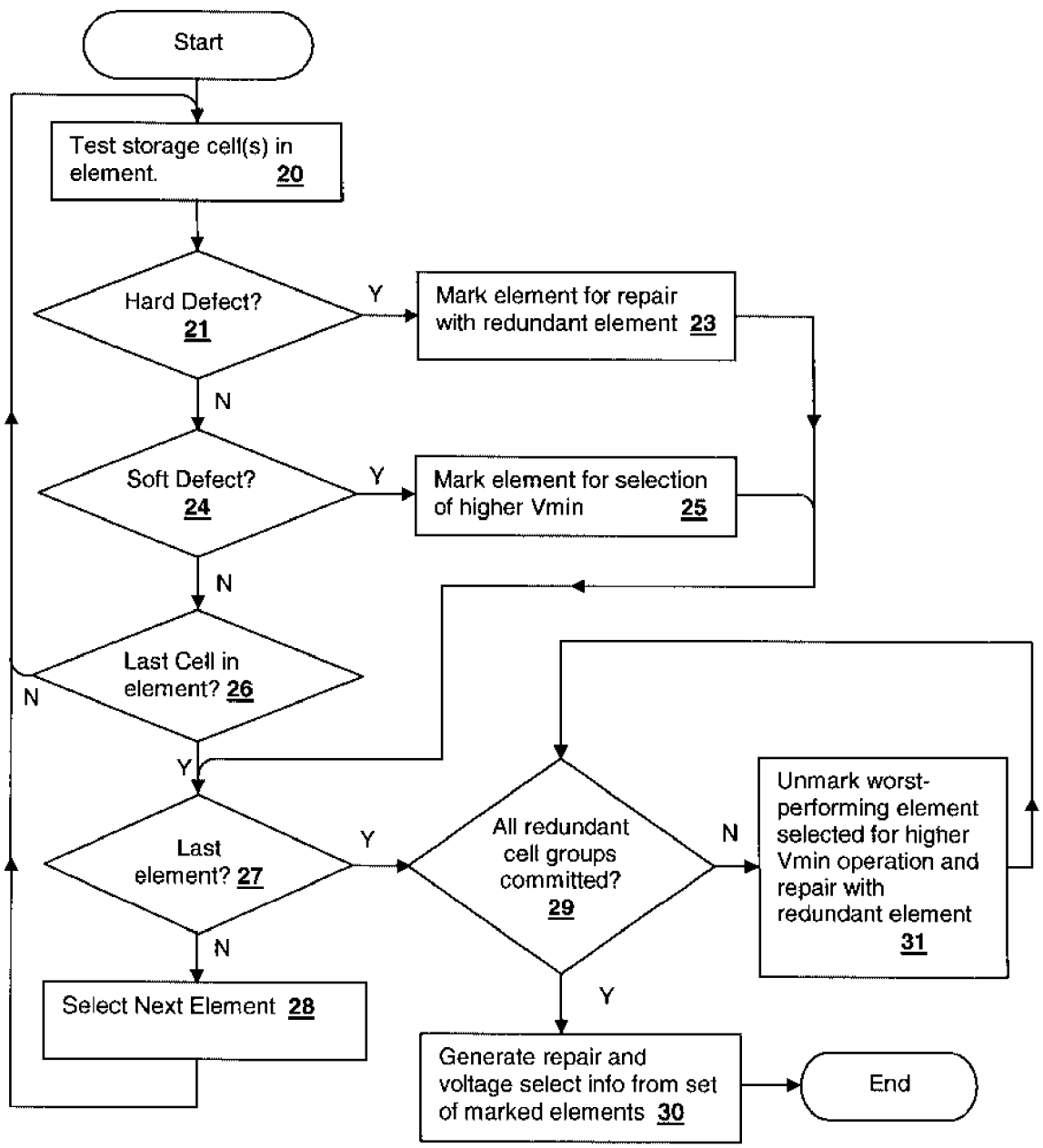
FIG. 2 is a flow chart illustrating a method in accordance with an embodiment of the invention.

Referring now to FIG. 2, a method according to an embodiment of the present invention is shown in a flowchart. First, the storage cells are tested to determine their performance (step 20). While, in general, all of the storage cells are tested in the array, under-sampling is possible and contemplated within the present invention, if models based on the data accurately predict failing storage cells without testing them individually. Further, since the testing will generally be performed over a wide range of operational environments, such as temperature and power supply voltage, the testing may be reduced by knowledge of monotonic behavior with respect to failures or degraded performance. The performance tested may include read and write timing margins, as well as writeability (write stability) and read stability. As shown, if a hard defect is detected in a storage cell (decision 21) the cell is marked for repair with a redundant element (step 23) as the element is expected to fail at all selectable operating voltages. However, if a soft failure is detected (decision 22), then the soft failure can be corrected either by repair, or by selecting a higher operating voltage for the element containing the cell. Initially, in the depicted method, the cell is marked for selecting of a higher minimum operating voltage (step 23).

Next, the testing and failure determinations are performed for each cell in the element up to the last cell (decision 26) and for each element until the last element (decision 27), selecting the next element (step 28). After all of the cells have been evaluated, if all redundant groups of cells are committed due to hard failures (decision 29), then the repair and voltage selection information are generated from the set of marked elements (step 30). Otherwise, an element marked for operation at the higher minimum operating voltage in step 23 is unmarked and replaced using a redundant group of cells. The selected element will generally be the worst-performing element from the test results, but that is not a limitation of the method. The depicted method is efficient for the above described case in which the redundant groups of cells are the same as the elements having selectable power supply voltages, e.g., redundant columns replacing voltage-selectable columns.

Figure 3:
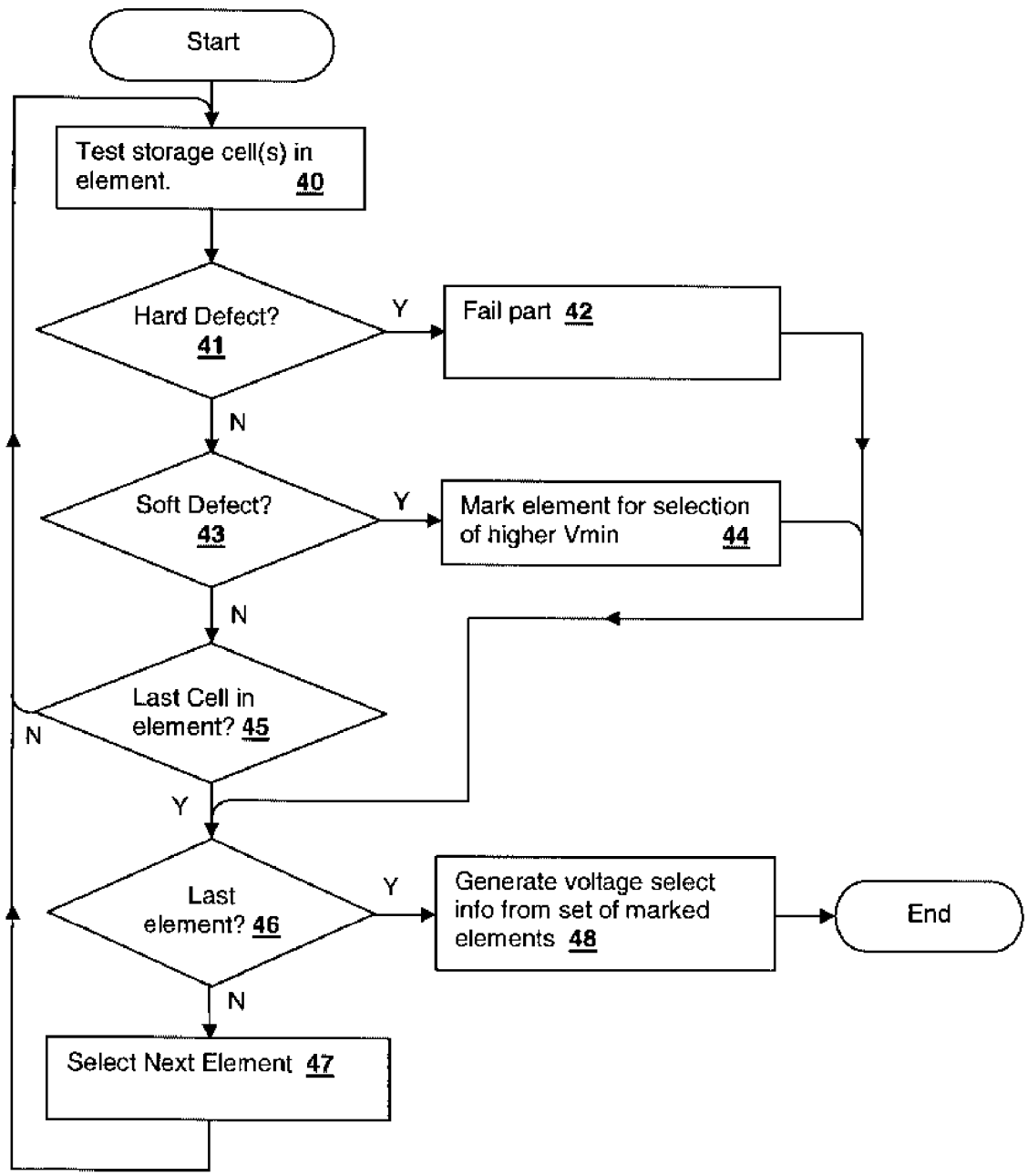
FIG. 3 is a flow chart illustrating a method in accordance with another embodiment of the invention.

Referring now to FIG. 3, a method in accordance with another embodiment of the present invention is shown. The method of FIG. 3 may be used when no redundant groups of cells are used or redundant groups of cells are not available to repair the storage device. Similar to the method of the FIG. 2, the storage cells are tested to determine their performance (step 40). If a hard defect is detected in a storage cell (decision 41) the part is failed (step 42). However, if a soft failure is detected (decision 43), then the soft failure can be corrected by selecting a higher operating voltage for the element containing the cell and the cell is marked for selecting of a higher minimum operating voltage (step 44). The testing and failure determinations are performed for each cell in the element up to the last cell (decision 45) and for each element until the last element (decision 46), selecting the next element (step 47). Finally, the voltage selection information is generated from the set of marked elements (step 48).

Figure 4:
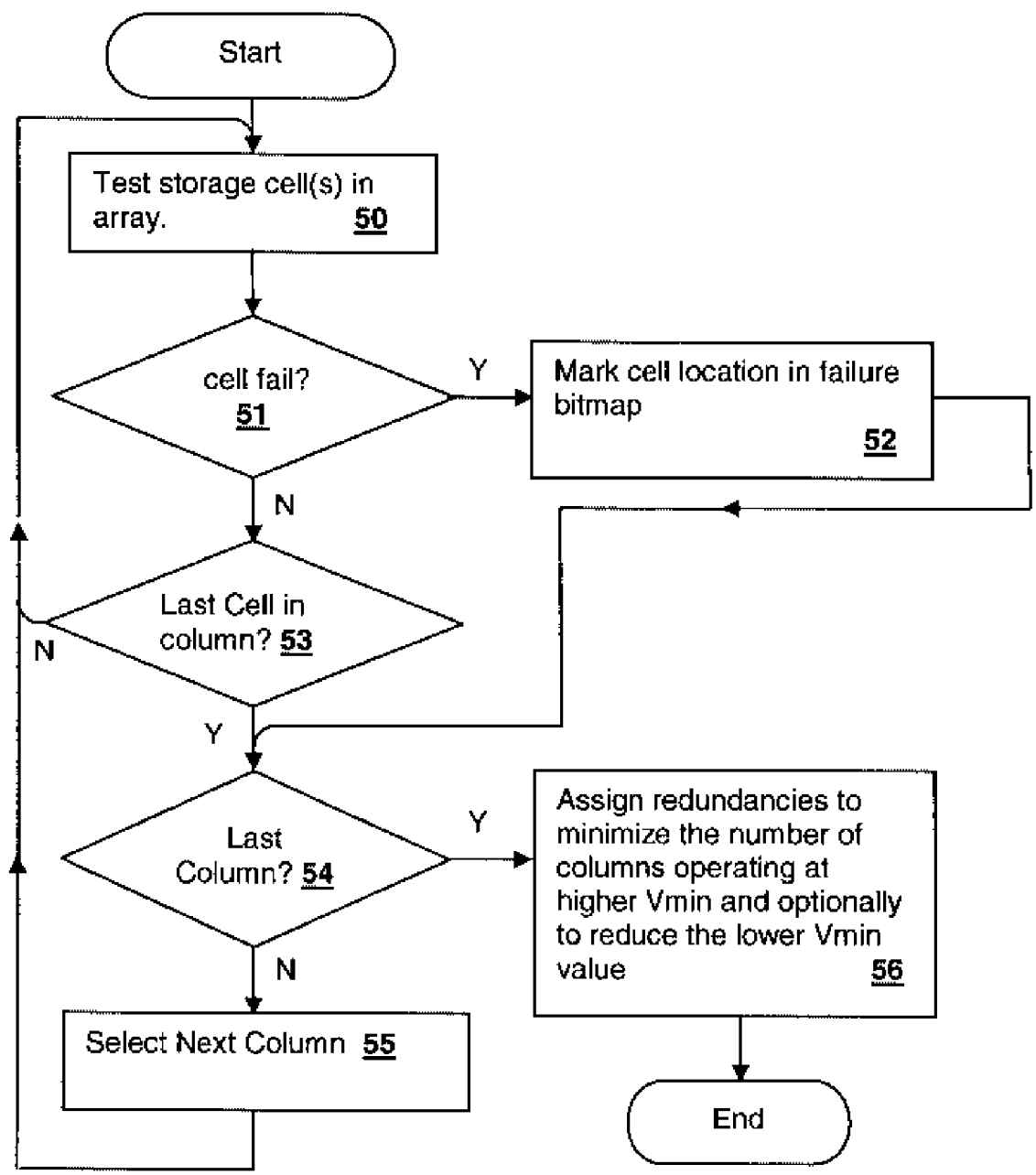
FIG. 4 is a flow chart illustrating a method in accordance with yet another embodiment of the invention.

Referring now to FIG. 4, yet another method according to an embodiment of the present invention is shown in a flowchart. The method of FIG. 4 is most applicable when the redundant groups of cells are orthogonal to the elements having selectable power supply voltage (e.g., arrays in which the per-column power supply voltage is selectable, but the redundant groups of cells are rows). As in the methods of FIG. 2 and FIG. 3, the storage cells are tested to determine their performance (step 50). If a cell failure (soft failure) is detected in a storage cell (decision 51) its location is marked in a bitmap of failures in the array. The testing and marking are performed for each cell in the column up to the last cell (decision 53) and for each column in the array (decision 54), selecting the next column (step 55). After all of the cells have been evaluated and mapped, the method then assigns the redundancies to minimize the number of columns operating at the higher Vmin and optionally to reduce the value of the lower selectable Vmin value (step 56). A number of optimization techniques may be applied in step 56, for example an exhaustive search of values in the array to determine the optimum combination of redundancies and power supply voltage selections. For example, a bipartite graph corresponding to rows and columns can be employed to find a vertex cover solution that minimizes the number of columns operating at the higher selectable Vmin value. Branch and bound techniques can be applied to solve for both the minimum number of elements selected for higher voltage operation and to explore the potential reduction of the lower Vmin value. Generic vertex cover analysis can also be utilized. Also, particular sub-optimal solutions will also provide selection of redundancy repairs and element power supply voltage selection values to provide the required yield.

Figure 5:
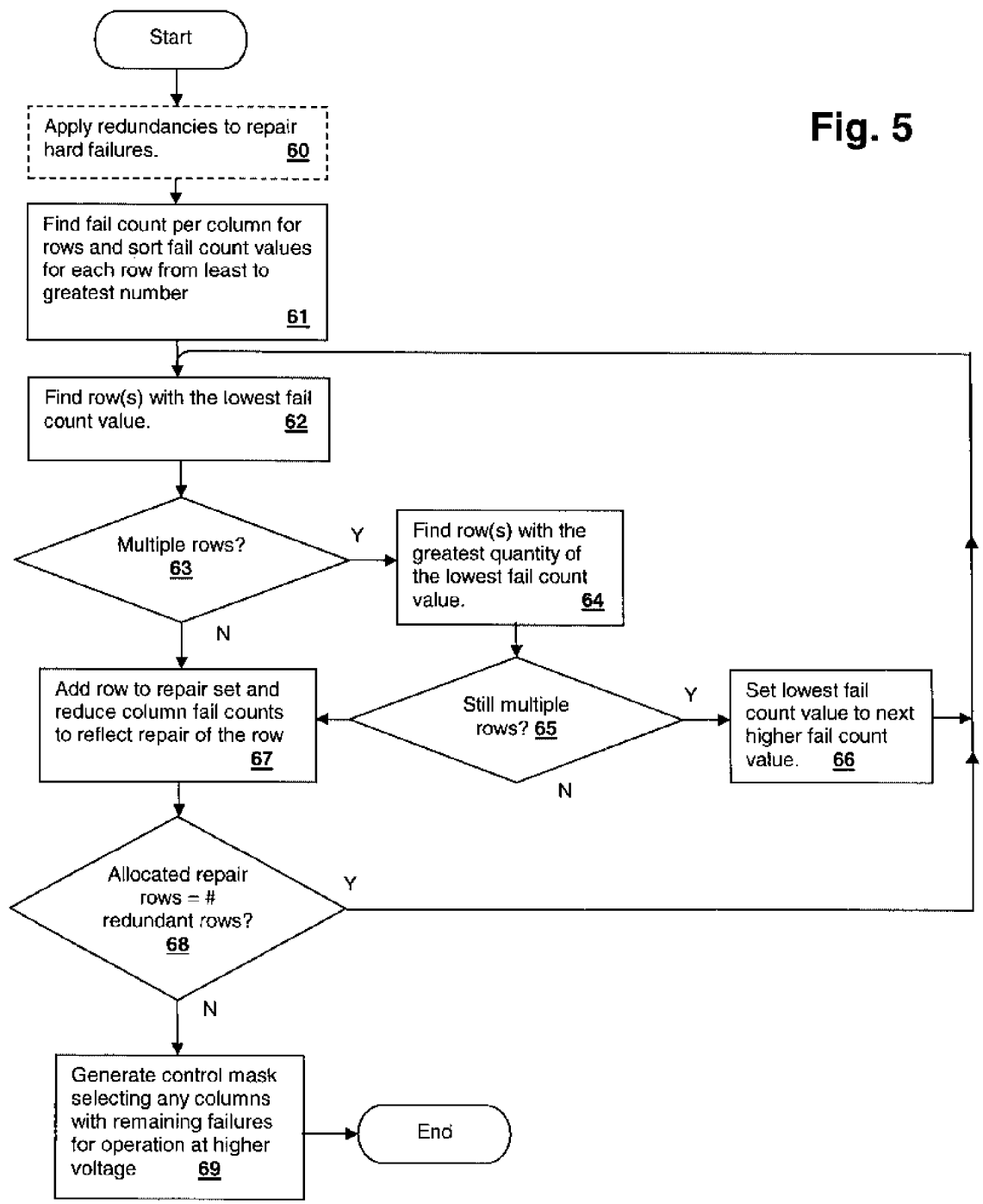
FIG. 5 is a flow chart illustrating a method in accordance with still another embodiment of the invention.

One such sub-optimal solution is illustrated in FIG. 5, which provides a fast and useful heuristic for determining which rows to replace with redundant rows in order to reduce the number of columns that are selected for operation at the higher power supply value. Initially, redundancies may be applied to repair hard failures (step 60). Alternatively, the hard failures may be combined with the soft failures repaired by the method to reduce the voltage selection, as long as the solution is constrained to always repair the hard errors. First, the fail count values totaled for each column in which a row has a failure and the fail count values are sorted for each row from the least number of failures to the greatest number of failures (step 61). If a row does not have a failure in a column position, no count is assigned. Next, the row(s) with the lowest fail count value in any position is/are found as candidates for repair (step 62), as those rows have the greatest likelihood of repairing the greatest number of columns. If multiple rows have the same failure count value selected in step 62 (decision 63), then the row(s) with the greatest quantity of the lowest fail count value is/are found (step 64) and if multiple rows have the same number of the lowest fail count value (decision 65), then the lowest fail count value being tested is incremented (step 66) and steps 62-66 are repeated until the best candidate row is found for repair. When the best candidate row is found, the row is added to repair set and the column fail counts are reduced by the failures for that row (step 67). Steps 62-67 are repeated until the number of rows allocated for repaid is equal to the number of redundant rows available (decision 68) and then the voltage control mask is built selecting any columns having remaining cell failures for operation at the higher power supply voltage (step 69).

Figure 6:
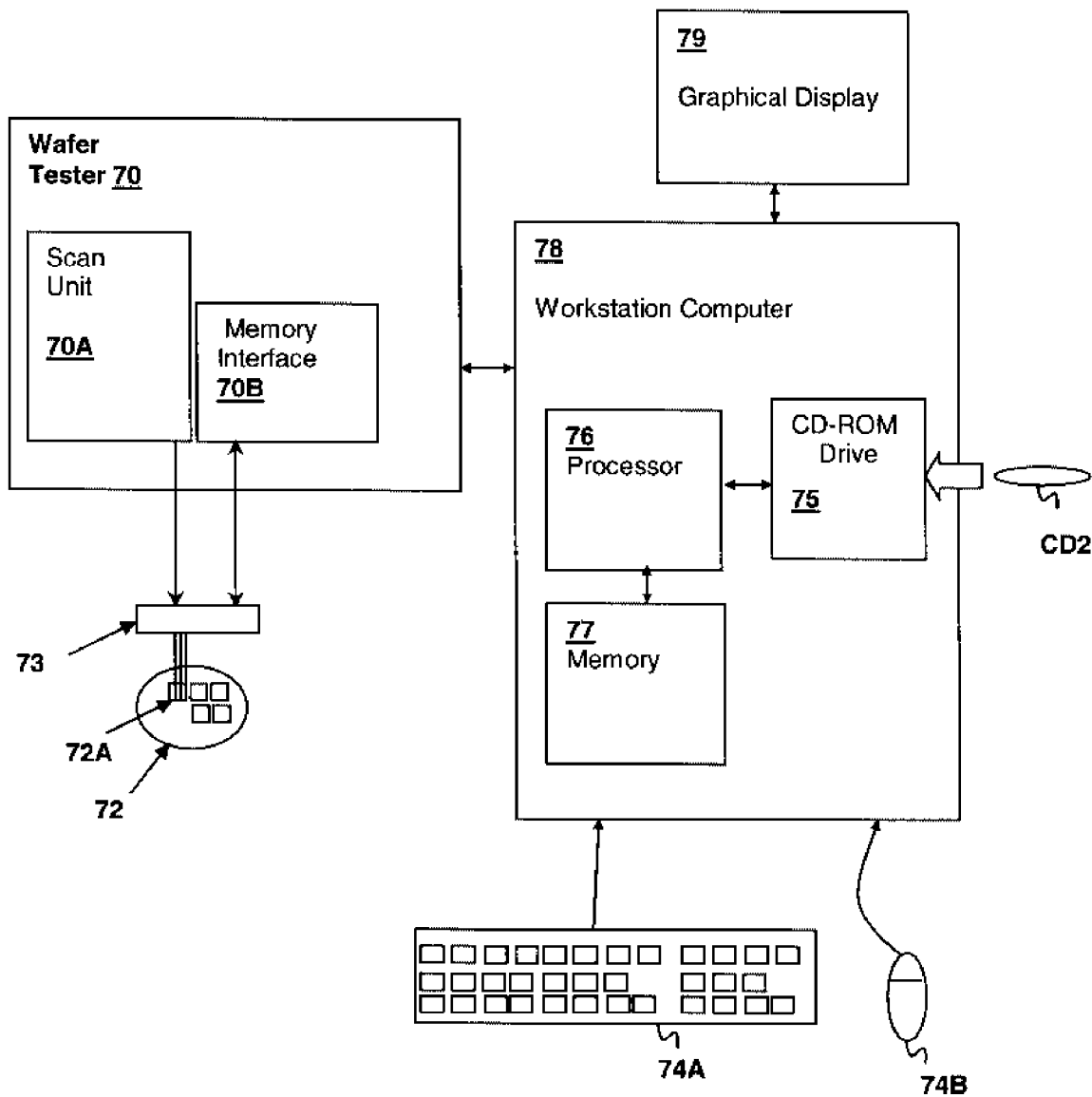
FIG. 6 is a wafer test system which may be used to perform methods in accordance with embodiments of the present invention.

Referring now to FIG. 6, a VLSI wafer test system for obtaining the digital control values and determining repairs is depicted. The system of FIG. 6 provides a mechanism that can obtain a set of digital control values for use in the storage devices described above, as well as selecting redundant groups of cells across elements or redundant elements for repair. A wafer tester 70 includes a boundary scan unit 70A for providing stimulus to and retrieving data from a die 72A on a wafer under test 72 via a probe head 73 having electrical test connections to die 72A. Wafer tester 70 includes a memory interface 70B for exercising a storage device in accordance with an embodiment of the present invention that is integrated on die 72A.

A workstation computer 78, has a processor 76 coupled to a memory 77, for executing program instructions from memory 77, wherein the program instructions include program instructions for setting digital control values within the storage devices integrated on die 72A, receiving data from memory interface tester 70B and transferring control values to and from scan unit 70A. Workstation computer 78 is coupled to wafer tester 70 via an electrical interface. Generally, the test methodology employed to obtain the digital control values operates scan unit 70A to set the digital control values within storage devices integrated on die 72A and then operates memory interface 70B under controlled environmental characteristics such as temperature and power supply voltage, to test the storage device, including varying the frequency of operation and/or other timing characteristics provided by memory interface 70B to detect failures within the storage devices on die 72A. The failures can be detected by operating the storage devices on die 72A at the lowest selectable power supply voltage, e.g. $V_{DDLO}$ and then raising the voltage for failed elements if any failure occurs. Alternatively, the selection values for all of the elements may be set to a particular state, and the tests performed using only the power supply voltage input associated with that state and varying the applied voltage. Once any repairs and needed voltage selection values are known, a set of digital control values associated with the storage devices integrated on die 72A can be recorded for future use with the final device that includes die 72A, e.g. by providing computer readable media such as compact disc CD2 written by CD-ROM drive 75 and encoding values for initializing the device with the digital voltage selection control values and optionally a set of repair values, if the repair is not effected by a fuse or mask. Compact disc CD2 can also contain program instructions for performing the testing methods of the present invention according to a computer program. As an alternative to associating media with die 72A if the digital selection values are provided by a fuse or mask on die 72A, the values can be programmed or used to inform a subsequent mask-metallization/metal removal process. As another alternative to media such as compact disc CD2, a non-volatile storage device can be programmed with the digital control values and read by a processor, or a circuit integrated on die 72A, to initialize the storage devices with the digital voltage selection control values.

Figure 7:
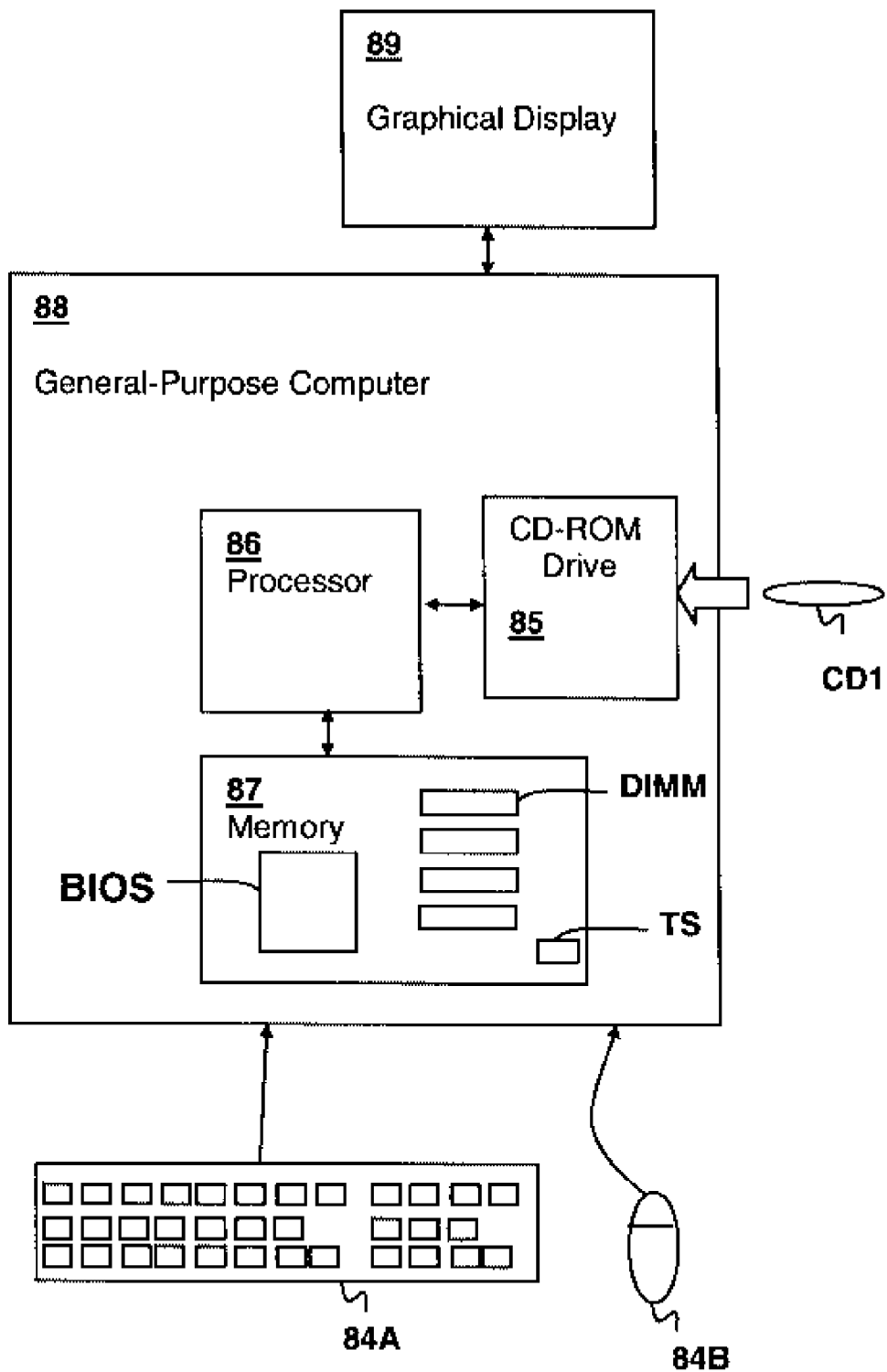
FIG. 7 is a pictorial block diagram illustrating a general-purpose computer system in which values resulting from methods of the present invention are applied.

Referring now to FIG. 7, a general-purpose computer system in accordance with an embodiment of the present invention is shown as may use the control values determined by the workstation computer system of FIG. 6. A general-purpose computer 88 is coupled to a graphical display 89 for displaying program output, such as an interface to an operating system including features in accordance with an embodiment of the present invention that set the digital control values of each storage device included in one or more memory modules DIMM within memory 87. General-purpose computer 88 is also coupled to input devices such as a keyboard 84A and a pointing device 84B. A processor 86 within general-purpose computer 88 executes program instructions stored in memory 87, including program instructions include in a built-in operating system non-volatile storage BIOS. Program instructions within memory 87 retrieve a set of digital control values for each of the storage devices within memory modules DIMM, and transfer the control values via one of the interface types mentioned above or another interface, to memory modules DIMM, so that the proper operating voltages are set within each element of the devices making up memory modules DIMM. To ensure proper initialization, the default voltage of voltage selection circuits can be arranged to be $V_{DDHI}$, the system can be operated from program instructions in non-volatile storage such as built-in operating system non-volatile storage BIOS, or the system can be initialized at lower frequency operating point or all selectable voltages can be initially set to $V_{DDHI}$. The digital control values, as well as the program/operating system driver can be supplied with memory modules DIMM on media such as compact disc CD1, and read via a CD-ROM drive 85. A temperature sensor TS may be included within memory 87 to provide an indication of operating temperature, and the program instructions may change the digital selection values in response to a detected range or value of temperature. The digital selection values may be changed at detection of other system changes, such as change of processor frequency or system operating voltage, so that yields may further be improved and/or power consumption further reduced.

While the invention has been particularly shown and described with reference to the preferred embodiment thereof, it will be understood by those skilled in the art that the foregoing and other changes in form, and details may be made therein without departing from the spirit and scope of the invention.

What is claimed is:

1. A computer performed method for determining digital voltage selection control values for a storage device having per-element selectable power supply voltages, comprising:
   performance testing of storage cells within a plurality of elements of the storage device;
   determining whether or not a result of the testing indicates that one or more storage cells or other circuits within a particular element have marginal performance or fail at a nominal desired operating voltage for the storage device;
   in response to determining that the result of the testing indicates that the one or more storage cells or other circuits within a particular element have marginal performance or fail at the desired operating voltage, setting a state of a digital control value corresponding to the particular element within a data set stored within a computer-readable storage of the computer system, wherein the state of the digital control value selects a higher operating power supply value for the particular element; and
   in response to determining that the result of the testing indicates that the one or more storage cells or other circuits within the particular element do not have marginal performance and do not fail at the desired operating voltage, setting a different state of the corresponding digital control value within the data set.

2. The method of claim 1, further comprising:
   physically installing the storage device in a system;
   installing the data set into the system via the media; and
   initializing the storage device by setting states of the digital control values in accordance with the data set.

3. The method of claim 1, further comprising:
   reading the data set to determine the states of the digital control values; and
   modifying a die containing the storage device to set the digital control values.

4. The method of claim 1, further comprising:
   in response to determining that the result of the testing indicates that the one or more storage cells or other circuits within a particular element have marginal performance or fail at the desired operating voltage, determining whether or not a redundant group of cells is available to replace the at least one cell in the element;

in response to determining that a redundant element is available, repairing the storage device by replacing the at least one cell with a cell in the redundant group of cells; and in response to determining that a redundant element is not available, performing the setting a state of a digital control value corresponding to the particular element within a data set having an entry for each of said plurality of elements, wherein the state of the digital control value selects a higher operating power supply value for the particular element.

5. The method of claim 4, wherein the plurality of elements form an array having rows and columns, wherein the elements are columns of the array, wherein the redundant group of cells is a redundant row of the array, and wherein the repairing replaces a row of the array that includes the at least one cell.

6. The method of claim 5, further comprising computing an indication for each row of the array that indicates the relative merit of replacing that row with a redundant row, and wherein the repairing is performed selectively for rows having a high merit of replacing the row with a redundant row.

7. The method of claim 6, wherein the computing is performed by:
determining which row has a greatest number of failing or marginal performance storage cells located in columns having the least number of failing or marginal performance storage cells to find a best repair candidate row;
adding the best repair candidate row to a set of rows considered for repair; and
repeating the determining and adding until the number of redundant rows available for repair is zero.

8. The method of claim 6, wherein the setting is performed for columns for which the determining has determined that the one or more storage cells or other circuits within a particular element have marginal performance or fail at the desired operating voltage and further in conformity with determining which of the one or more storage cells have not been replaced by the repairing.

9. A workstation computer system, comprising:
a processor for executing program instructions;
a memory for storing the program instructions; and
an interface to a device tester for testing a storage device under a variety of operating conditions, and wherein the program instructions comprise program instructions for
performance testing storage cells within a plurality of elements of the storage device,
determining whether or not a result of the testing indicates that one or more storage cells or other circuits within a particular element have marginal performance or fail at a nominal desired operating voltage for the storage device,
in response to determining that the result of the testing indicates that the one or more storage cells or other circuits within a particular element have marginal performance or fail at the desired operating voltage, setting a state of a digital control value corresponding to the particular element within a data set, wherein the state of the digital control value selects a higher operating power supply value for the particular element, and
in response to determining that the result of the testing indicates that the one or more storage cells or other circuits within the particular element do not have marginal performance and do not fail at the desired operating voltage, setting a different state of the corresponding digital control value within the data set.

10. The workstation computer system of claim 9, wherein the program instructions further comprise program instructions for writing a non-volatile media associated with the storage device with the data set.

11. The workstation computer system of claim 9, further comprising program instructions for:
reading the data set to determine the states of the digital control values; and
modifying a die containing the storage device to set the digital control values.

12. The workstation computer system of claim 9, wherein the program instructions further comprise program instructions for:
in response to determining that the result of the testing indicates that the one or more storage cells or other circuits within a particular element have marginal performance or fail at the desired operating voltage, determining whether or not a redundant group of cells is available to replace the at least one cell in the element;
in response to determining that a redundant element is available, repairing the storage device by replacing the at least one cell with a cell in the redundant group of cells; and
in response to determining that a redundant element is not available, performing the setting a state of a digital control value corresponding to the particular element within a data set having an entry for each of said plurality of elements, wherein the state of the digital control value selects a higher operating power supply value for the particular element.

13. The workstation computer system of claim 12, wherein the plurality of elements form an array having rows and columns, wherein the elements are columns of the array, wherein the redundant group of cells is a redundant row of the array, and wherein the program instructions for repairing replace a row of the array that includes the at least one cell.

14. The workstation computer system of claim 13, further comprising program instructions for computing an indication for each row of the array that indicates the relative merit of replacing that row with a redundant row, and wherein the repairing is performed selectively for rows having a high merit of replacing the row with a redundant row.

15. The workstation computer system of claim 14, wherein the program instructions for computing comprise program instructions for:
determining which row has a greatest number of failing or marginal performance storage cells located in columns having the least number of failing or marginal performance storage cells to find a best repair candidate row;
adding the best repair candidate row to a set of rows considered for repair; and
repeatedly executing the program instructions for determining and adding until the number of redundant rows available for repair is zero.

16. The workstation computer system of claim 14, wherein the setting is performed for columns for which the determining has determined that the one or more storage cells or other circuits within a particular element have marginal performance or fail at the desired operating voltage and further in conformity with determining which of the one or more storage cells have not been replaced by the repairing.

17. A computer program product comprising computer-readable storage media encoding program instructions for execution by a processor in a workstation computer system including an interface to a device tester for testing a storage device under a variety of operating conditions, wherein the program instructions comprise program instructions for:

performance testing storage cells within each of a plurality of elements of the storage device;

determining whether or not a result of the testing indicates that one or more storage cells or other circuits within a particular element have marginal performance or fail at a nominal desired operating voltage for the storage device;

in response to determining that the result of the testing indicates that the one or more storage cells or other circuits within a particular element have marginal performance or fail at the desired operating voltage, setting a state of a digital control value corresponding to the particular element within a data set stored within a computer-readable storage of the workstation computer system, wherein the state of the digital control value selects a higher operating power supply value for the particular element; and in response to determining that the result of the testing indicates that the one or more storage cells or other circuits within the particular element do not have marginal performance and do not fail at the desired operating voltage, setting a different state of the corresponding digital control value within the data set.

18. The computer program product of claim 17, wherein the program instructions further comprise program instructions for writing a non-volatile media associated with the storage device with the data set.

19. The computer program product of claim 18, further comprising program instructions for:

reading the data set to determine the states of the digital control values; and modifying a die containing the storage device to set the digital control values.

20. The computer program product of claim 17, wherein the program instructions further comprise program instructions for:

in response to determining that the result of the testing indicates that the one or more storage cells or other circuits within a particular element have marginal performance or fail at the desired operating voltage, determining whether or not a redundant group of cells is available to replace the at least one cell in the element;

in response to determining that a redundant element is available, repairing the storage device by replacing the at least one cell with a cell in the redundant group of cells; and in response to determining that a redundant element is not available, performing the setting a state of a digital control value corresponding to the particular element within a data set having an entry for each of said plurality of elements, wherein the state of the digital control value selects a higher operating power supply value for the particular element.

21. The computer program product of claim 20, wherein the plurality of elements form an array having rows and columns, wherein the elements are columns of the array, wherein the redundant group of cells is a redundant row of the array, and wherein the program instructions for repairing replace a row of the array that includes the at least one cell.

22. The computer program product of claim 21, further comprising program instructions for computing an indication for each row of the array that indicates the relative merit of replacing that row with a redundant row, and wherein the repairing is performed selectively for rows having a high merit of replacing the row with a redundant row.

23. The computer program product of claim 22, wherein the program instructions for computing comprise program instructions for:

determining which row has a greatest number of failing or marginal performance storage cells located in columns having the least number of failing or marginal performance storage cells to find a best repair candidate row;

adding the best repair candidate row to a set of rows considered for repair; and repeatedly executing the program instructions for determining and adding until the number of redundant rows available for repair is zero.

24. The computer program product of claim 22, wherein the setting is performed for columns for which the determining has determined that the one or more storage cells or other circuits within a particular element have marginal performance or fail at the desired operating voltage and further in conformity with determining which of the one or more storage cells have not been replaced by the repairing.

* * * * *